United States Patent
Wimplinger

(10) Patent No.: US 8,927,335 B2
(45) Date of Patent: Jan. 6, 2015

(54) METHOD FOR BONDING OF CHIPS ON WAFERS

(75) Inventor: Markus Wimplinger, Ried im Innkreis (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 377 days.

(21) Appl. No.: 13/496,024

(22) PCT Filed: Sep. 3, 2010

(86) PCT No.: PCT/EP2010/005422
§ 371 (c)(1),
(2), (4) Date: Mar. 14, 2012

(87) PCT Pub. No.: WO2011/032647
PCT Pub. Date: Mar. 24, 2011

(65) Prior Publication Data
US 2012/0184069 A1    Jul. 19, 2012

(30) Foreign Application Priority Data
Sep. 18, 2009  (EP) .................................... 09011911

(51) Int. Cl.
H01L 21/78    (2006.01)
H01L 21/56    (2006.01)
H01L 21/683   (2006.01)
H01L 25/00    (2006.01)
H01L 23/00    (2006.01)
H01L 23/31    (2006.01)

(52) U.S. Cl.
CPC ........... *H01L 21/568* (2013.01); *H01L 2224/81* (2013.01); *H01L 21/6835* (2013.01); *H01L 23/3128* (2013.01); *H01L 25/50* (2013.01); *H01L 2221/68331* (2013.01); *H01L 2224/16225* (2013.01); *H01L 2224/97* (2013.01);
(Continued)

(58) Field of Classification Search
CPC ............ H01L 2224/81; H01L 2224/97; H01L 21/568; H01L 21/6835
USPC ................. 438/109, 110, 112, 113, 127, 118; 257/686, E21.599
See application file for complete search history.

(56) References Cited

U.S. PATENT DOCUMENTS 5,605,844 A    2/1997 Oki et al. ........................... 437/8
6,383,844 B2 *  5/2002 Mimata et al. ................. 438/118
(Continued)

FOREIGN PATENT DOCUMENTS

JP    11-74230       3/1999
JP    2001-085363    3/2001    ............ H01L 21/301
(Continued)

OTHER PUBLICATIONS

International Search Report for International Application No. PCT/EP2010/005422, Mar. 7, 2011.
(Continued)

*Primary Examiner* — Mary Wilczewski
(74) *Attorney, Agent, or Firm* — Kusner & Jaffe

(57) ABSTRACT

Method for bonding of a plurality of chips onto a base wafer which contains chips on the front, the chips being stacked in at least one layer on the back of the base wafer and electrically conductive connections are established between the vertically adjacent chips, with the following steps: a) fixing of the front of the base wafer on a carrier, b) placing at least one layer of chips in defined positions on the back of the base wafer, and c) heat treatment of the chips on the base wafer fixed on the carrier, characterized in that prior to step c) at least partial separation of the chips of the base wafer into separated chip stack sections of the base after takes place.

25 Claims, 3 Drawing Sheets

(52) U.S. Cl.
CPC ............... *H01L 2924/01322* (2013.01); *H01L 2225/06513* (2013.01); *H01L 2225/06541* (2013.01); *H01L 2225/06568* (2013.01); H01L 24/97 (2013.01); *H01L 2224/0401* (2013.01); *H01L 2224/0557* (2013.01); *H01L 2924/15311* (2013.01); *H01L 2224/80205* (2013.01); H01L 24/74 (2013.01); *H01L 2224/83005* (2013.01); *H01L 2224/74* (2013.01); *H01L 2224/80075* (2013.01); *H01L 2221/68304* (2013.01); *H01L 2224/80805* (2013.01); *H01L 2224/80065* (2013.01); *H01L 2224/8082* (2013.01); *H01L 24/08* (2013.01); *H01L 24/16* (2013.01); *H01L 24/32* (2013.01); *H01L 21/6836* (2013.01); *H01L 24/80* (2013.01); *H01L 24/81* (2013.01); *H01L 24/83* (2013.01); *H01L 2221/68327* (2013.01); *H01L 2221/68381* (2013.01); *H01L 2224/08225* (2013.01); *H01L 2224/32225* (2013.01); *H01L 2224/73204* (2013.01); *H01L 2224/80006* (2013.01); *H01L 2224/81005* (2013.01); *H01L 2224/81065* (2013.01); *H01L 2224/81075* (2013.01); *H01L 2224/81205* (2013.01); *H01L 2224/81805* (2013.01); *H01L 2224/81815* (2013.01); *H01L 2224/8182* (2013.01); *H01L 2224/81907* (2013.01); *H01L 2224/83065* (2013.01); *H01L 2224/83075* (2013.01); *H01L 2224/83205* (2013.01); *H01L 2224/83805* (2013.01); *H01L 2224/83815* (2013.01); *H01L 2224/8382* (2013.01); *H01L 2224/83907* (2013.01); *H01L 2924/15738* (2013.01); *H01L 2224/7598* (2013.01); *H01L 2224/80815* (2013.01); *H01L 2224/80907* (2013.01)
USPC ........... 438/109; 438/110; 438/112; 438/113; 438/118; 438/127; 257/686; 257/E21.599

(56) References Cited

U.S. PATENT DOCUMENTS

| | | | |
|---|---|---|---|
| 6,492,196 | B1 | 12/2002 | Chen .............................. 438/106 |
| 7,727,806 | B2 * | 6/2010 | Uhland et al. ................. 438/109 |
| 7,863,092 | B1 * | 1/2011 | Chaware et al. .............. 438/106 |
| 7,910,454 | B2 * | 3/2011 | Thallner ........................ 438/455 |
| 8,552,567 | B2 * | 10/2013 | England et al. ............... 257/777 |
| 8,597,980 | B2 * | 12/2013 | Wimplinger ................... 438/107 |
| 2007/0001281 | A1 | 1/2007 | Ishino et al. ................... 257/686 |
| 2008/0064187 | A1 * | 3/2008 | Brown ........................... 438/464 |
| 2011/0020982 | A1 * | 1/2011 | Wimplinger ................... 438/107 |
| 2012/0184069 | A1 * | 7/2012 | Wimplinger ................... 438/109 |

FOREIGN PATENT DOCUMENTS

| | | | |
|---|---|---|---|
| JP | 2007-012848 | 1/2007 | .......... H01L 21/8242 |
| JP | 2008-130704 | 6/2008 | ............ H01L 25/065 |
| JP | 2009-176957 | 8/2009 | ............ H01L 25/065 |
| JP | 2009-188254 | 8/2009 | ............ H01L 21/301 |

OTHER PUBLICATIONS

Office Action issued in connection with corresponding Japanese Patent Application No. 2012-529140, dated Sep. 22, 2014.

* cited by examiner

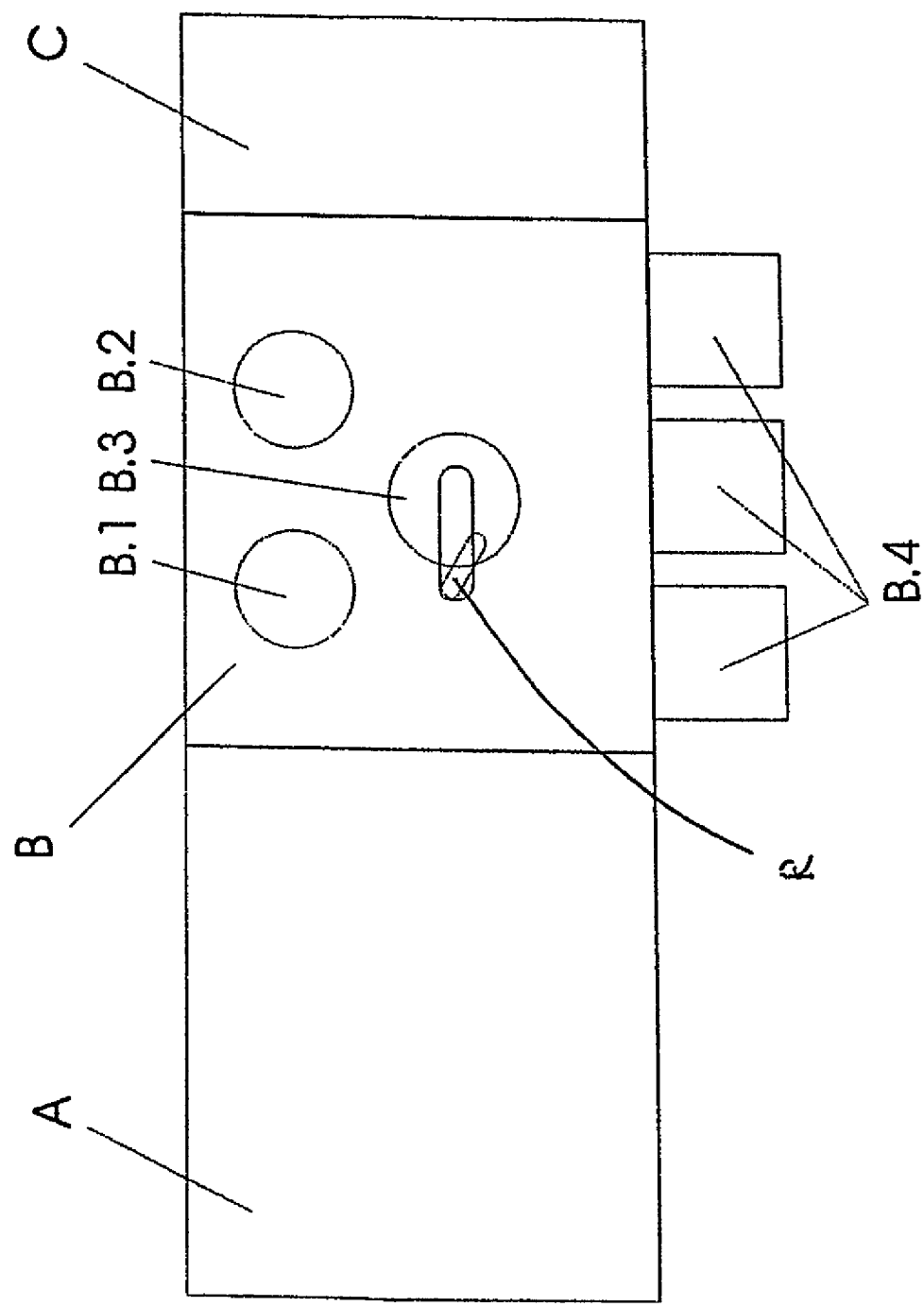

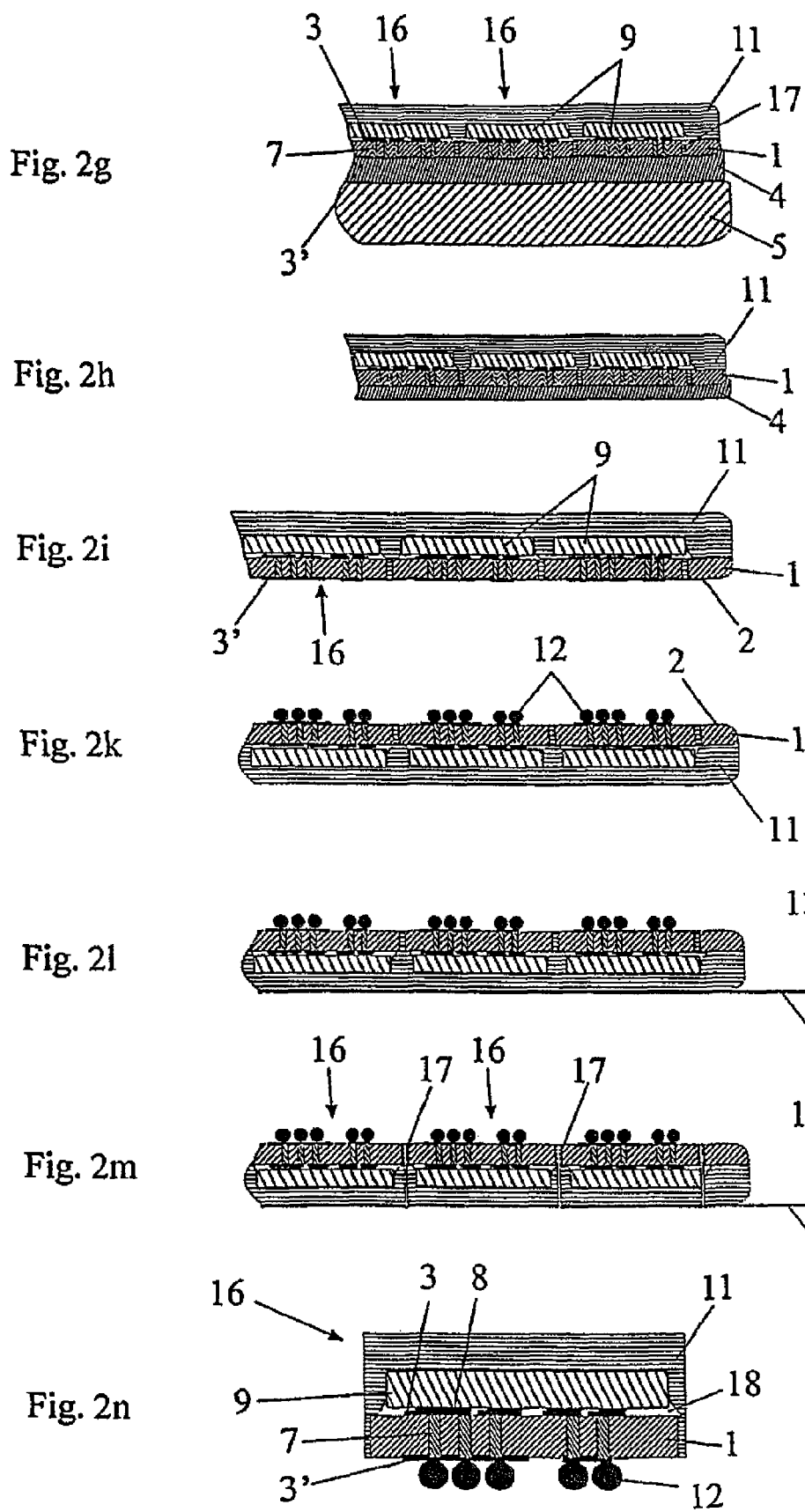

METHOD FOR BONDING OF CHIPS ON WAFERS

This application is the U.S. National Stage Under 35 U.S.C. 371 of International Application No. PCT/EP2010/005422 filed on Sep. 3, 2010, which claims benefit of European Patent Application 09011911.6 filed on Sep. 18, 2009.

FIELD OF THE INVENTION

The invention relates to a method for bonding a plurality of chips onto a base.

BACKGROUND OF THE INVENTION

As a result of the miniaturization pressure which is prevailing in the semiconductor industry, methods are needed with which so-called "3D Integrated Chips" (3D IC) can be produced. 3D ICs consist of chip stacks in which several chips are stacked vertically on top of one another and there are connections through the silicon to the vertically adjacent chips. The connections are called "Through Silicon Vias" (TSV).

These chips promise high packing density and higher performance at lower costs. Moreover, in this way new types and forms of chips can be produced. Fundamentally different methods are possible for producing 3D ICs, specifically the very time-consuming stacking of individual chips on individual chips, also called "Chip-to-Chip" (C2C) methods, or stacking of wafers on wafers, also called "Wafer to Wafer" (W2W) methods. Finally, the so-called "Chip to Wafer (C2W)" method is also discussed. A reasonable technical implementation has not been successful to date due to major technical problems. This invention relates to a technically feasible C2W method for producing 3D ICs.

Due to low throughput, C2C methods cause higher production costs and therefore may hardly be used in mass production.

W2W methods require that the two wafers have the same size and that the chips on the two wafers have the same size. The problem here is that the silicon utilization especially for higher chip stacks is below average (so-called yield). The attainable yield of functioning chips is lower than in C2C or C2W methods.

Technical problems in the implementation of a C2W method for producing chips stacks or 3D ICs are the handling of the wafers, especially with the chips stacked on them, and the varied requirements, especially temperatures, for the stacking process and for the connectors (interfaces) of the chips for mounting on circuit boards or fundamentally the higher-order packing unit.

Handling of the base wafer therefore acquires great importance because fracture of the base wafer shortly before separation of a plurality of chip stacks on the wafer would lead to scrapping of thousands of expensive chips. Handling of the base wafer with a plurality of chip stacks fixed/bonded thereon becomes more difficult, the thinner and/or greater the area of the base wafer. The base wafer is the wafer on which the chips are stacked in the C2W method.

US 2007/001281 A1 relates to a method for producing a semiconductor memory in which chips are stacked on the base wafer and then potted in resin to simplify production logistics in the production of memory chips. After potting, the memory chips are separated from their adjacent memory chips. In particular, different thermal expansions of the different materials of the diverse components present in the chip stacks are a problem during production, mainly when potting the memory chips and in the release from the carrier, and possible subsequent process steps.

SUMMARY OF THE INVENTION

The object of the invention is to devise a method as free of scrap as possible for producing chip stacks (3D ICs) which are positioned as exactly as possible, with a throughput as high as possible.

This object is achieved with the features of the independent claim(s) Advantageous developments of the invention are given in the dependent claims. All combinations of at least two of the features given in the specification, in the claims and/or the drawings lie within the framework of the invention. For the given value ranges values within the indicated limits will also be considered disclosed as boundary values and can be claimed in any combination.

The invention is based on the idea of fixing the base wafer at least during the stacking of chips on the base wafer, and during the heat treatment of the chips for bonding, fixing the wafer on a carrier or connecting it to the carrier, and of at least partially separating the base wafer at latest before heat treatment, especially into chip stack sections which have preferably been separated from one another.

By fixing the base wafer on the carrier it is possible with a surprising advantage for the throughput of the C2W method to separate the process steps of stacking or placing the chips in defined positions on the base wafer and the process step(s) of heat treatment or bonding of the chips on the base wafer. While heat treatment or the bonding step, depending on the material used, can take a very long time, the positioning or stacking and placement of the chips on the base wafer is a process step which can proceed very promptly, for example with several thousand chips per hour. When the base wafer is moreover present separated into smaller parts during heat treatment, thermal expansion of the different components/materials has a much smaller effect on the quality of the chip stacks. As a result of separation, the chips stacks are less stressed by the different expansions.

In this way, the throughput can be increased by there being several heat treatment chambers/bonding stations and/or by several base wafers with stacked chips being processed in a heat treatment chamber/bonding station. Heat treatment chambers can be hot plates, continuous furnaces or the like. One especially advantageous process can be implemented with modified wafer bonding chambers which make it possible to apply pressure to the chips during the heat treatment process.

Compared to other methods, the possibility of being able to stack chips of different size in this method is especially advantageous.

By using a carrier which is not only loosely joined to the base wafer, stresses and cambers of the base wafer can be equalized or counteracted.

Handling is still further simplified by the carrier consisting at least partially of silicon and/or glass and corresponding essentially to the size of the base wafer, especially by its not deviating more than 10 mm, especially 5 mm, preferably 2 mm, even more preferably 1 mm, from the latter in radius.

Especially preferred fixing means are a negative pressure or vacuum, electrostatic means, mechanical clamping and/or adhesives, preferably heat-resistant adhesives being used in order to ensure secure fixing of the base wafer on the carrier even at high temperatures in heat treatment. Combinations of different fixing means or effects, depending on the type of connection to be established or the height of the chip stack or due to other factors, can lead to further improved handling.

In one preferred embodiment of the invention, alignment and contact-making of electrically conductive laminae applied to the vertically adjacent chips take place directly in the placement of the chips in defined positions with the corresponding electrically conductive connection of the underlying layer of chips.

The chip yield in this method can be advantageously improved in that during placement of the chips it is watched that chips are placed only on functioning chips of the underlying layer of chips. Even more preferably the function of all chips which are functionally joined to the chip to be placed is checked and a chip is placed only with the function of all chips which are to be functionally joined to the chip.

In heat treatment or the bonding step electrically conductive connections are produced between the wafer and the chip which has been placed on it or between the placed chips. Here it is advantageous if heating takes place in a suitable atmosphere which is preferably free of oxygen, so that oxidation of the metal contact surfaces is avoided. In particular this can be achieved by the use of a nitrogen atmosphere or another inert atmosphere, for example argon, for many applications not only an inert, but also a reducing atmosphere being especially advantageous. This property can be achieved for example by forming gas or formic acid vapor. Forming gas can be formed by mixing H2 with N2, especially between 2% H2 to 98% H2 and 15% H2 to 85% N2. In this mixture N2 can also be replaced by other inert gases.

So that the chips can be handled better and do not slide after they are placed, it is advantageous to pre-fix the chips after placement, especially to adhere them, preferably with an organic adhesive which vaporizes during the following bonding step. Alternatively the chips can be fixed by a molecular connection which advantageously forms spontaneously at room temperature, for example between the Si surfaces, SiO2 surfaces or SiN surfaces. Another alternative is ultrasonic welding.

Advantageously heat treatment takes place especially continuously, at a temperature <280° C., especially <250° C., preferably <220° C. The adhesives used as claimed in the invention must be suitable for the aforementioned temperatures, these adhesives only recently being available at all. An example of these adhesives is the HAT series from Brewer-Science Inc., USA.

The base wafer in one special configuration of the invention, especially by back grinding, has a thickness of less than 200 especially less than 100 μm, preferably less than 50 μm, still more preferably less than 20 μm.

Especially many chips can be accommodated on a base wafer with a diameter of at least 200 mm, especially at least 300 mm, preferably at least 450 mm.

In one special embodiment of the invention it is possible only by this invention to apply solder bumps or C4 bumps after step b or c for connecting each chip stack to a board or fundamentally the next higher-order packing unit.

The solder bumps consist of a metal alloy with a low melting point and are generally used to connect the chips/chip stacks to other electrical/electronic components.

In particular, when using a base wafer with electrically conductive connections which penetrate the base wafer (TSVs) it is advantageous to pot the chips or chip stacks after step b or c in a mass which is characterized especially by high thermal and/or mechanical stability and/or water-repellent properties, especially a mass of organic and/or of ceramic material. An embodiment is especially preferred in which at least in part epoxy resin is contained in the mass or the mass is formed entirely from epoxy resin. The epoxy resin-containing mass can be fiber-reinforced in one special embodiment of the invention.

Advantageously the mass is poured in liquid form at room temperature or at a higher temperature.

In one advantageous embodiment of the invention, the mass is pressurized after potting, especially by relief to atmospheric pressure after carrying out the potting below atmospheric pressure, preferably in a vacuum. This moreover results in that possible gaps and/or cavities are filled with the mass; this contributes to long-term reliability of the chip stacks.

The base wafer can be advantageously taken from the carrier after potting by the action of the preferably duroplastic mass.

In one preferred embodiment of the invention, the mass is worked such that the mass after potting or during potting is brought into the basic form corresponding to the base wafer and/or the mass is removed as far as the uppermost layer of the chip, especially is ground off. This additionally simplifies further handling of the body consisting of the base wafer, the potted chips and the mass, and especially known constructions for handling can be used. By removing the mass a cooling body can be advantageously applied to the uppermost layer by a precise planar surface being formed.

One especially preferred embodiment of the invention consists in that the base wafer and/or the carrier consist of silicon, therefore the carrier is likewise a wafer. It can be handled with the known constructions and has the additional advantage that the coefficient of thermal expansion of the carrier, to the extent the base wafer and carrier consist of silicon, is identical.

Other advantages, features and details of the invention will become apparent from the following description of preferred exemplary embodiments and using the drawings.

BRIEF DESCRIPTION OF THE DRAWINGS

FIG. 1 shows the structure of a unit for implementation of the method as claimed in the invention, FIG. 2g shows a schematic of the potting step as claimed in the invention, FIG. 2h shows a schematic of the detachment step as claimed in the invention for detaching a carrier from the base wafer, FIG. 2i shows a schematic of the cleaning step as claimed in the invention, FIG. 2k shows a schematic of the step as claimed in the invention for applying solder bumps, FIG. 2l shows a schematic of application as claimed in the invention to a film frame, FIG. 2m shows a schematic of a dicing step as claimed in the invention, FIG. 2n shows a schematic of the chip stack as claimed in the invention.

In the figures the same components and parts with the same function are identified with the same reference numbers.

DETAILED DESCRIPTION OF THE INVENTION

Figure 2A:
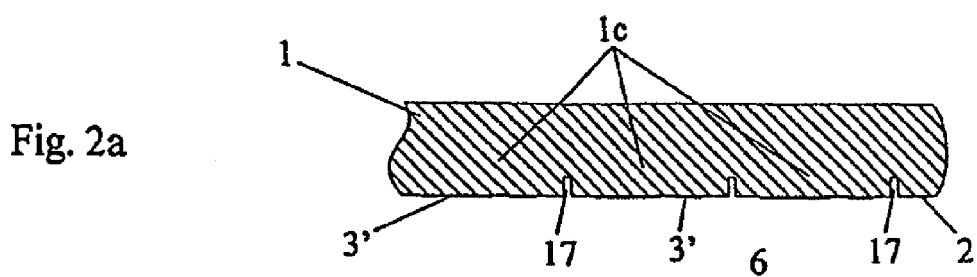
FIG. 2a shows a schematic of a base wafer as claimed in the invention.
Figure 2B:
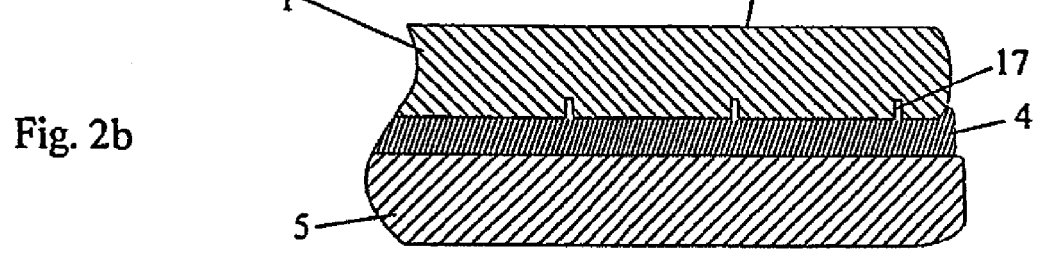
FIG. 2b shows a schematic of a temporary bonding step as claimed in the invention.
Figure 2C:
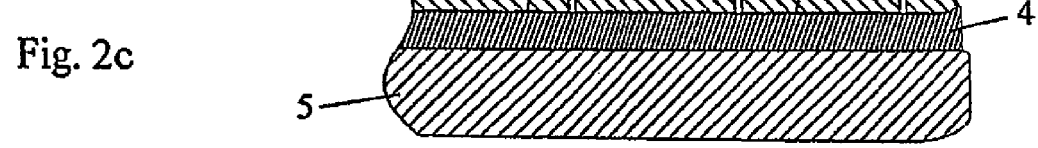
FIG. 2c shows a schematic of the back grinding step as claimed in the invention.
Figure 2D:
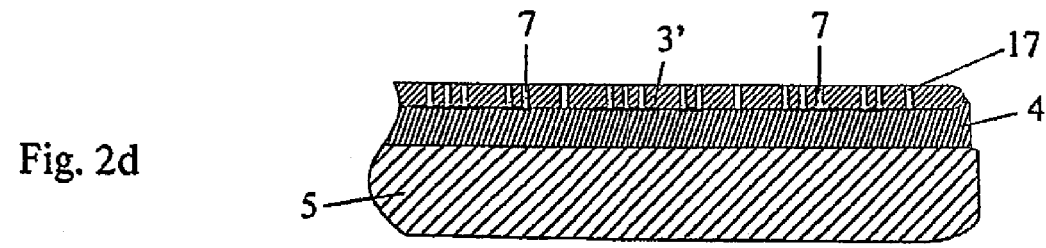
FIG. 2d shows a schematic of the step as claimed in the invention for forming electrically conductive connections in the base wafer.
Figure 2E:
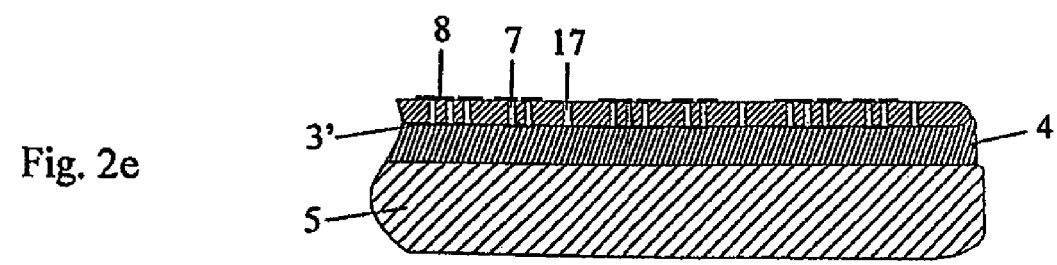
FIG. 2e shows a schematic of the step of back side metallization as claimed in the invention, especially application of electrically conductive laminae to the surface of the base wafer.
Figure 2F:
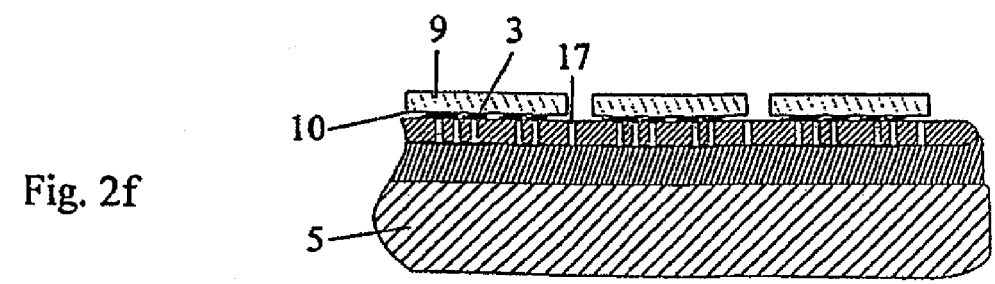
FIG. 2f shows a schematic of the positioning step and heat treatment step as claimed in the invention.

FIG. 1 shows the schematic structure of a unit for carrying out the method as claimed in the invention, in the region A placement of the chip layers on the base wafer 1 taking place as shown in FIG. 2f, after the base wafer 1 at station B.1 has been mounted, or in some other way, for example pre-mounted, on the carrier 5, and at the tape removal station B.2 a back grinding tape which is present from a previous back grinding process having been removed.

The carrier 5 with the base wafer 1 is handled by way of a robot B.3 with a robot arm R.

On the handling module B there is a cassette station B.4 from which materials and/or components necessary for the method for producing the chip stacks 16 are removed or delivered again.

After placement of the chip in the chip placement system A, the carrier 5 with the base wafer 1 and the chips 9 which are stacked on the base wafer 1 and which are optionally fixed by way of an adhesive is routed to the bonding station C for heat treatment or bonding of the chips onto the base wafer 1. During heat treatment or during bonding, the next base wafer 1 can be provided with chips 9, The bonding station C can also consist of several bonding units, since bonding, depending on the requirement profile, can take considerable time, especially compared to placement of the chips.

Other treatment steps with the chip stack bonded on the base wafer 1, such as for example the separation of the chip stacks 16 in a dicing module, are not shown in FIG. 1, but can follow the bonding station C or preferably can be located in the region of the handling module B, therefore in FIG. 1 above the handling module B so that handling of the chip stacks 16 by way of the robot arm R is possible. In one preferred embodiment of the invention the carrier 5 can also be used in the dicing module, as a result of which the chip stack 16 can also continue to be safely handled even after bonding with the base wafer 1.

FIG. 2a shows the silicon base wafer 1 whose front 2 is provided with electrically conductive laminae 3' which project from the surface of the front 2 by preceding treatment steps.

Dicing grooves 17 formed in the front 2 divide the base wafer 1 into chip stack sections 1c. The dicing grooves 17 extend advantageously only over part of the thickness of the base wafer 1 as far as the base wafer is back-ground from its back in a later step.

The base wafer 1 as shown in FIG. 2b is connected to the carrier 5, here likewise a silicon wafer, by way of connecting means 4 in order to be able to be back-ground from the back 6 of the base wafer 1 (see FIG. 2c). Here the base wafer 1 and thus the chip stack sections 1c are more or less automatically separated during back grinding, as a result of which later, especially different thermal expansions have a much smaller effect on the quality of the chip stack.

As shown in FIG. 2d, in the region of each lamina 3' electrical connections 7 which extend from the back 6 of the base wafer 1 to the respective lamina 3' are produced from the back 6 of the base wafer 1.

Electrically conductive lamina 8 are applied to the electrically conductive connections 7 on the back 6 of the base wafer 1 for electrical contact-making of electrically conductive laminae 3 on chips 9 (see FIG. 2e). In special embodiments of the invention the chips 9 can also make contact directly with the electrically conductive connections 7, or other electrically conductive linking points can be produced.

As shown in FIG. 2f, the chips 9 with their laminae 3 arranged at the bottom side 10 are applied to the electrically conductive lamina 8. This process sequence can take place with or without a heat treatment step or bonding step between the individual placement steps. Placement of the chips 9 on the base wafer 1 takes place at the chip placement station A.

In the process step as shown in FIG. 2g, the chips 9 are potted in a mass 11, in this exemplary embodiment epoxy resin. Due to the previous separation as claimed in the invention before the step of potting any thermal expansion takes effect to a much smaller degree, especially for different coefficients of thermal expansion of the materials.

Cavities 18, as FIG. 2n clearly shows, can be advantageously filled by suitable material selection or pairing by means of capillary action, optionally supported by pressurization.

After bonding of the chips 9 and setting of the mass 11, the carrier 5 can be removed, since the mass 11 sufficiently stabilizes the thin wafer 1. The carrier 5 can be automatically detached by loosening the connecting means 4 in the potting step as shown in FIG. 2g (depending on heat). Furthermore it can be advantageous to carry out the detachment step separately in a downstream process step, and the detachment step can be initiated either thermally, chemically or by the action of an external energy source (for example UV light, infrared light, laser, or microwave).

In FIG. 2h the carrier 5 has been detached and in FIG. 2i the connecting means 4 is removed, especially by cleaning in a cleaning step.

The base wafer 1 has been turned in the process step as shown in FIG. 2k for applying solder bumps 12 to the laminae 3' (see FIG. 2i) so that the front 2 is now pointing up. The solder bumps 12 are used for later connection of the chip stacks 16 (3d ICs) to boards or the next higher-order packing unit/chip layer.

A series of versions is possible as the material for the connection between the laminae 3, 3', 8 and/or the chips 9. Fundamentally it is possible to distinguish between metallic compounds, organic compounds, inorganic compounds, and hybrid compounds. In the domain of metallic compounds, metal diffusion connections, eutectic connections which form during bonding, and eutectics which were already present before bonding and which during bonding enable melting of the alloy, are possible.

The latter are also the solder bumps 12 which are applied to the laminae 3, 3' in the form of balls and which enable production of connections essentially without applying pressure. Conductive polymers are also possible.

In the process step as shown in FIG. 2l, the base wafer 1 with the chip stacks 16 and solder bumps 12 is deposited on a tape 14 attached to the dicing frame 13 in order to then separate the chip stacks 16 from one another as shown in FIG. 2m (dicing). Separation takes place in the region of the dicing grooves 17, especially orthogonally to the base wafer 1. As a result the separated chip stack 16 (3D IC) shown in FIG. 2n is obtained which consists of the chip stack section 1c of the base wafer 1 with the electrically conductive connections 7 (vias) which penetrate the base wafer 1, chips 9 connected to the vias 7 through electrically conductive laminae 3, 8 solder beads 12 attached to the laminae 3' and the mass 11.

DESCRIPTION OF THE REFERENCE NUMERALS

A chip placement station
B handling module
B.1 transfer station
B.2 tape removal station
B.3 robot with robot arm
B.4 cassette station
C bonding station
R robot arm
1 base wafer
1c chip stacking sections
2 front
3, 3' electrically conductive lamina
4 connecting means
5 carrier
6 back
7 electrically conductive connection
8 electrically conductive lamina
9 chips
10 bottom side
11 mass
12 solder bumps
13 dicing frame
14 tape
16 chip stack
17 dicing grooves
18 cavities Having described the invention, the following is claimed:

1. Method for bonding a plurality of chips onto a base wafer, the chips being arranged on the base wafer in at least one layer, wherein electrically conductive connections are established for connecting vertically adjacent chips, said method comprising:
   a) fixing the base wafer on a carrier,
   b) placing the chips in defined positions on the base wafer in at least one layer, and
   c) heat treatment of the chips on the base wafer fixed on the carrier to bond the chips on the base wafer,
   wherein prior to step c) at least a portion of the base wafer is separated into chip stack sections of the base wafer.

2. Method as claimed in claim 1, wherein step b) and c) are carried out in different devices.

3. Method as claimed in claim 1, wherein fixing means are used for fixing the base wafer on the carrier.

4. Method as claimed in claim 3, wherein said fixing means includes a vacuum, elastratic means, mechanical clamping and/or adhesives.

5. Method as claimed in claim 4, wherein said adhesives are heat-resistant adhesives.

6. Method as claimed in claim 1, wherein the method further comprises:
   applying electrically conductive laminae to the chips in placement of the chips in defined positions; and
   aligning and bonding the electrically conductive laminae applied to the chips to a corresponding electrically conductive laminae for connection to an underlying layer of chips.

7. Method as claimed in claim 1, wherein the method further comprises adhering the chips after placing the chips in the defined positions on the base wafer.

8. Method as claimed in claim 7, wherein said wherein said chips are adhered with an organic adhesive, or by molecular connection.

9. Method as claimed in claim 1, wherein said heat treatment of the chips takes place at a temperature <280° C.

10. Method as claimed in claim 9, wherein said heat treatment of the chips takes place continuously.

11. Method as claimed in claim 9, wherein said heat treatment of the chips takes place at a temperature <250° C.

12. Method as claimed in claim 9, wherein said heat treatment of the chips takes place at a temperature <220° C.

13. Method as claimed in claim 1, wherein, after steps b) or c), potting the chips or chip stacks in a mass having high thermal and/or mechanical and/or chemical stability and/or water-repellent properties.

14. Method as claimed in claim 13, wherein the method further comprises removing the base wafer from the carrier after potting.

15. Method as claimed in claim 13, wherein the base wafer with the mass and the chips potted in the mass after potting or during potting is brought into basic form corresponding to the base wafer and/or the mass is removed as far as an uppermost layer of the chips.

16. Method as claimed in claim 15, wherein said mass is removed as far as the uppermost layer of the chips by grinding off.

17. Method as claimed in claim 13, wherein said mass includes an organic material or a ceramic material.

18. Method as claimed in claim 17, wherein said organic material includes an epoxy resin.

19. Method as claimed in claim 1, wherein after step b) or c), applying solder bumps for connection of each chip stack to a board or another chip.

20. Method as claimed in claim 1, wherein the base wafer and/or the carrier consist at least predominantly of silicon.

21. Method as claimed in claim 1, wherein at least two layers of the chips are applied to the base wafer.

22. Method as claimed in claim 1, wherein the chips or chip stacks after step b) or c) are hot-embossed with a mass.

23. Method as claimed in claim 22, wherein the mass is a thermoplastic material.

24. Method as claimed in claim 1, wherein the base wafer with the chips stacked on it is fixed on a dicing frame before the chip stack is separated from adjacent chip stacks.

25. Method as claimed in claim 1, wherein the base wafer is separated during back-grinding.

* * * * *